(12) United States Patent
Park

(10) Patent No.: US 8,581,621 B2
(45) Date of Patent: Nov. 12, 2013

(54) SEMICONDUCTOR MEMORY DEVICE, MEMORY CONTROLLER AND MEMORY SYSTEM HAVING ON DIE TERMINATION AND ON DIE TERMINATION CONTROLLING METHOD

(75) Inventor: Joon-Young Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/471,656

(22) Filed: May 15, 2012

(65) Prior Publication Data
US 2013/0002291 A1    Jan. 3, 2013

(30) Foreign Application Priority Data

Jun. 30, 2011    (KR) ........................ 10-2011-0064966

(51) Int. Cl.
*H03K 19/003*    (2006.01)

(52) U.S. Cl.
USPC .............................................. 326/30; 326/26

(58) Field of Classification Search
USPC .................................................... 326/26, 30
See application file for complete search history.

(56) References Cited

U.S. PATENT DOCUMENTS

| | | | |
|---|---|---|---|
| 6,922,076 B2 * | 7/2005 | Braceras et al. | 326/30 |
| 7,068,064 B1 * | 6/2006 | Yen | 326/30 |
| 2009/0146683 A1 * | 6/2009 | Kim | 326/30 |

FOREIGN PATENT DOCUMENTS

| | | |
|---|---|---|
| JP | 2009-294864 A | 12/2009 |
| JP | 2010-170296 A | 8/2010 |
| KR | 10-2005-0095387 A | 9/2005 |

* cited by examiner

*Primary Examiner* — James H Cho
(74) *Attorney, Agent, or Firm* — Lee & Morse, P.C.

(57) ABSTRACT

A semiconductor memory device includes a first memory chip including a first on die termination (ODT) unit electrically connected to a first pad, the first pad being connected to a first terminal to receive a first signal, and a second memory chip including a second ODT unit electrically connected to a second pad, the second pad being connected to the first terminal to receive the first signal, the first ODT unit being configured to turn on/off according to a memory operation, the second ODT unit being configured to turn off regardless of the memory operation, and the first and second ODT units are switchable.

20 Claims, 12 Drawing Sheets

SEMICONDUCTOR MEMORY DEVICE, MEMORY CONTROLLER AND MEMORY SYSTEM HAVING ON DIE TERMINATION AND ON DIE TERMINATION CONTROLLING METHOD

CROSS-REFERENCE TO RELATED APPLICATIONS

This application claims the benefit of Korean Patent Application No. 10-2011-0064966, filed on Jun. 30, 2011, in the Korean Intellectual Property Office, the disclosure of which is incorporated herein in its entirety by reference.

BACKGROUND

1. Field

The inventive concept relates to a semiconductor memory device, a memory controller, and a memory system, and more particularly, to a semiconductor memory device having a plurality of memory chips including an on-die termination, a memory controller, a memory system, and an on-die termination controlling method.

2. Description of the Related Art

In general, a semiconductor memory device includes an input/output buffer for transmitting and/or receiving signals to/from outside. However, as a reflection may occur due to impedance mismatching and may cause noise in the transmitted/received signals, the semiconductor memory device may include an on die termination (ODT) that provides a signal transmission line with a termination resistance component for impedance matching. The ODT prevents the signal from being reflected by using the termination resistor so as to improve signal integrity.

SUMMARY

The inventive concept provides a semiconductor memory device that prevents signal integrity from degrading due to a change of an ODT equivalent resistance value according to a skew between controlling timings of a plurality of ODTs and different operating states of chips, a memory controller, a memory system, and an ODT controlling method.

According to an aspect of the inventive concept, there is provided a semiconductor memory device including a first memory chip including a first on die termination (ODT) unit electrically connected to a first pad, the first pad being connected to a first terminal to receive a first signal, and a second memory chip including a second ODT unit electrically connected to a second pad, the second pad being connected to the first terminal to receive the first signal, wherein the first ODT unit is configured to turn on/off according to a memory operation, the second ODT unit is configured to turn off regardless of the memory operation, and the first and second ODT units are switchable.

The first signal may be a data signal, and when a data write operation of the semiconductor memory device is performed, the first ODT unit may be turned on during input of the data signal.

The first memory chip may further include a third pad connected to a second terminal, the third pad being configured to receive a first ODT control signal, the second memory chip may further include a fourth pad connected to a third terminal, the fourth pad being configured to receive a second ODT control signal, and one of the first and second ODT control signals is deactivated regardless of the memory operation.

Each of the first and second ODT control signals may have a signal level according to an operating status of the semiconductor memory device and may be configured to turn on/off a status of a respective first ODT unit or second ODT unit.

When the first memory chip operates in a first mode and the second memory chip operates in a second mode, the first ODT unit may be maintained in a turned off status, and the turning on/off of the second ODT unit may be controlled by the memory operation.

The first mode may be one of a refresh mode and a deep power down mode, and the second mode may be a normal operating mode.

Each of the first and second ODT units may include a termination resistor and a switch unit, the termination resistor being configured to provide a transfer line for transferring the first signal with a resistance component, and the switch unit being configured to control a connection between the termination resistor and the transfer line.

The first signal may be a data signal, and when a data write operation of the semiconductor memory device is performed, the switch unit in the first ODT unit may be turned on when the data signal is input.

According to another aspect of the inventive concept, there is provided a memory controller controlling a memory operation of a semiconductor memory device with a plurality of memory chips and respective ODT units, the memory controller including an ODT control signal generator configured to generate a first ODT control signal for controlling turning on/off operations of a first ODT unit in one of the plurality of memory chips according to the memory operation, to generate a second ODT control signal for maintaining a turned off status of ODT units in the memory chips other than the first ODT unit regardless of the memory operation, and to alterably provide the first ODT control signal to one of the plurality of memory chips.

The ODT control signal generator may be configured to select one of the plurality of memory chips as a representative memory chip and to provide the first ODT control signal to the representative memory chip to control a turning on/off operation of the ODT unit in the representative memory chip, when power is applied to the semiconductor memory device.

When the representative memory chip enters a refresh mode or a deep power down mode, the ODT control signal generator may be configured to select one of the other memory chips as the representative memory chip and to control the turning on/off operation of the ODT unit in the re-selected representative memory chip.

Each of the ODT units may include a termination resistor connected to a data input buffer or the memory chip and at least one switch unit, and when a data write operation of the semiconductor memory device is performed, the first ODT control signal for turning on the switch unit may be generated during provision of a data signal to the semiconductor memory device.

The ODT control signal generator may be configured to generate a plurality of ODT control signals corresponding to the plurality of memory chips, the plurality of ODT control signals being output to the plurality of memory chips via separate paths.

The memory controller may further include a memory status determination unit configured to determine operating states of the memory chips, and an ODT status determination unit configured to determine states of the ODT units in the memory chips, the first and second ODT control signals being generated by using at least one of the memory status determination unit and the ODT status determination unit results.

When at least one of the memory status determination unit and the ODT status determination unit is changed, the ODT control signal generator may be configured to change the memory chip to which the first ODT control signal is provided.

According to another aspect of the inventive concept, there is provided a semiconductor memory including a first memory chip including a first on die termination (ODT) unit electrically connected to a first pad, the first pad being connected to a first terminal to receive a first signal, and a second memory chip including a second ODT unit electrically connected to a second pad, the second pad being connected to the first terminal to receive the first signal, wherein only one of the first and second ODT units is configured to turn on/off according to memory operations of the first and second memory chips, and the other one of the first and second ODT units is configured to be deactivated and turn on only when the one of the first and second ODT units is not active.

The first signal may be a data signal, and when a data write operation of the semiconductor memory device is performed, the first ODT unit may be turned on during an input of the data signal.

The first and second memory chips may be configured to perform memory operations simultaneously, only one of the first and second ODT units being configured to turn on during the performed memory operations.

The first and second ODT units may be controlled independently via third and fourth pads, respectively.

The semiconductor memory device may further include a memory controller, the memory controller being electrically connected via separate wirings to the third and fourth pads.

According to another aspect of the present inventive concept, there is provided a method of controlling a semiconductor memory device including a plurality of memory chips, of the memory chips including an ODT unit, the method including inputting/outputting data signals into/from the memory chips via a common terminal of the semiconductor memory device, and controlling turning on/off operations of the ODT unit of a first memory chip according to the memory operation, maintaining turned off states of the ODT units in other memory chips regardless of the memory operation, determining an operating mode of the first memory chip, and controlling the turning on/off operations of the ODT unit of the second memory chip according to the determination result and maintaining the turned off states of the ODT units in the other memory chips.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
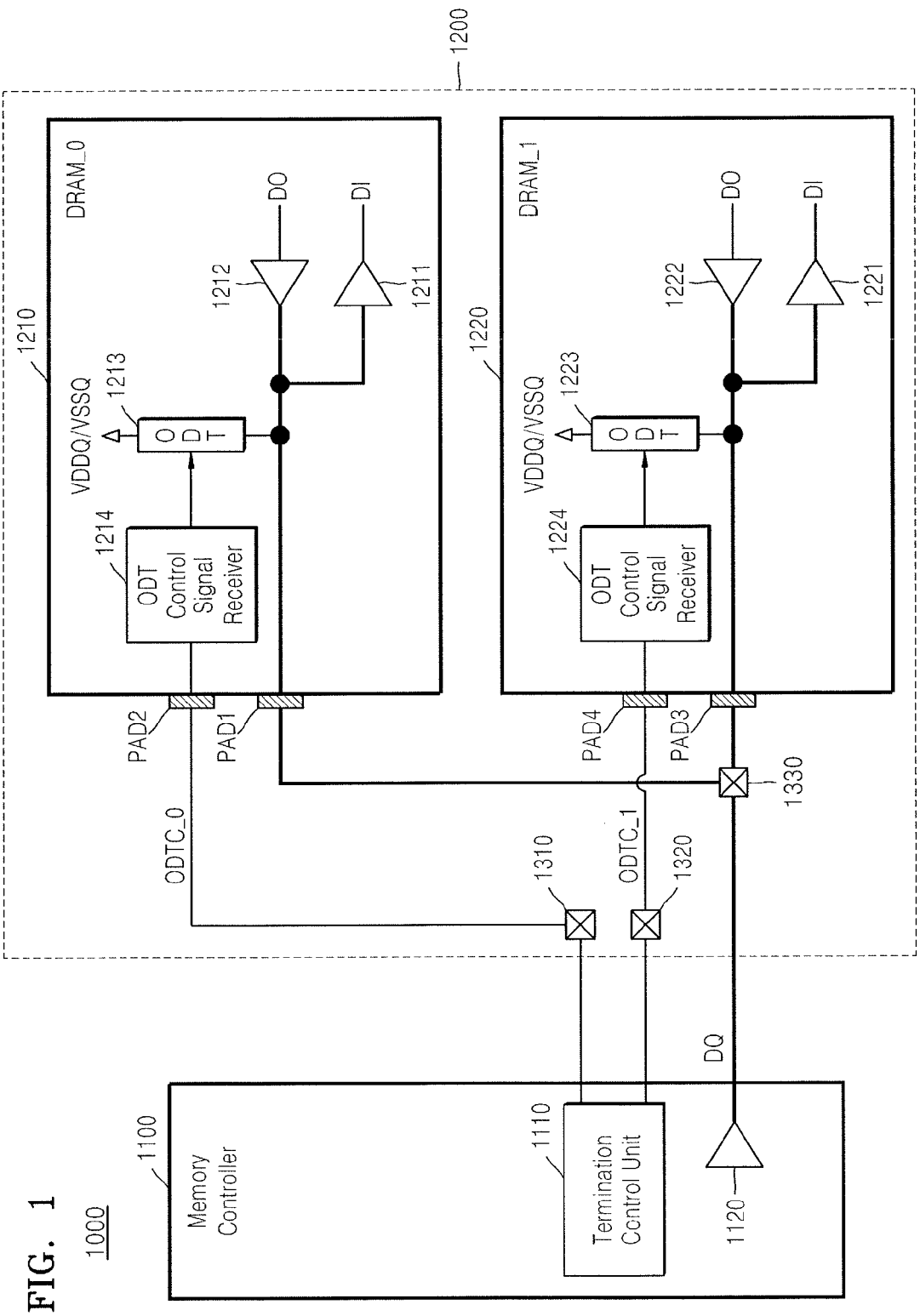
FIG. 1 illustrates a block diagram of a memory system according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element is referred to as being "between" two elements or "connected to" an element, it can be the only element between the two elements or connected to the element, or one or more intervening elements may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of a semiconductor memory device 1200, a memory controller 1100, and a memory system 1000 according to an embodiment of the present inventive concept. The memory system 1000 may include the memory controller 1100 and the semiconductor memory device 1200. The semiconductor memory device 1200 may be formed as a package in which a plurality of memory chips are stacked.

For example, as illustrated in FIG. 1, a first memory chip 1210 and a second memory chip 1220, e.g., formed of dynamic random access memory (DRAM), are stacked, and the first and second memory chips 1210 and 1220 share a terminal 1330, which receives a data signal DQ. The terminal 1330 is a conductive means that is attached to an external surface of the semiconductor memory device 1200 to communicate with the memory controller 1100, and may be formed of a conductive means, e.g., a solder ball or a pin. The semiconductor memory device 1200 includes various terminals 1310, 1320, and 1330. For example, the terminals 1310, 1320, and 1330 may be electrically connected to pads PAD1 through PAD4 of the memory chips 1210 and 1220 via conductive means, e.g., a bonding wire or a through-silicon via (TSV).

The memory controller 1100 selects one of the plurality of memory chips 1210 and 1220 to control recording/reading of data. The memory controller 1100 includes a termination controller 1110, i.e., a termination control unit 1110, which controls termination resistances of the first and second memory chips 1210 and 1220, and a data driver 1120 for inputting/outputting data into/from the first and second memory chips 1210 and 1220. Although not shown in FIG. 1, a command, an address signal, and chip selecting signals may be output from the memory controller 1100.

The memory controller 1100 and the first and second memory chips 1210 and 1220 are connected to each other via the terminals 1310, 1320, and 1330 formed on the external surface of the semiconductor memory device 1200. The terminals 1310, 1320, and 1330 may be formed of package pins, which may include a data pin, a data strobe pin, a data mask pin, and a termination data strobe pin. It is noted that "pin" widely refers to an electric interconnection to an integrated circuit, e.g., may include a solder ball, a pad, or another electric contact point on the integrated circuit. Hereinafter, reference to the terminals 1310, 1320, and 1330 and to respective pins 1310, 1320, and 1330 will be used interchangeably.

The first and second memory chips 1210 and 1220 may include data input buffers 1211 and 1221, respectively, which receive data to be written, data output buffers 1212 and 1222, respectively, which output read data, on die termination (ODT) units 1213 and 1223 (hereafter, first and second ODT units) including ODT resistances, respectively, and ODT control signal receivers 1214 and 1224 (hereafter, first and second ODT control signal receivers), respectively, which receive the ODT control signals. In addition, the first and second ODT units 1213 and 1223 may include termination resistors (not shown) that provide input terminals of the data input buffers 1211 and 1221 with resistance components, and switch units (not shown) which control connections between the termination resistors and the input terminals of the data input buffers 1211 and 1221.

The termination control unit 1110 generates a first ODT control signal ODTC_0 and a second ODT control signal ODTC_1 and provides them to the first and second memory chips 1210 and 1220. When it is assumed that the plurality of memory chips include the first memory chip 1210 and the second memory chip 1220, the first ODT control signal ODTC_0 is provided to the first ODT control signal receiver 1214 of the first memory chip 1210, and the second ODT control signal ODTC_1 is provided to the second ODT control signal receiver 1224 of the second memory chip 1220. In addition, the first and second ODT control signals ODTC_0 and ODTC_1 are respectively provided to the first and second memory chips 1210 and 1220 through separate pins 1310 and 1320 and separate pads PAD2 and PAD4.

The first and second ODT units 1213 and 1223 are included in the first and second memory chips 1210 and 1220, respectively, to provide transfer lines that transfer signals provided in the first and second memory chips 1210 and 1220 with resistance components. According to the embodiment of the present inventive concept, the termination resistor may be connected to the transfer line transferring one signal, or termination resistors may be respectively connected to the transfer lines transferring two or more signals. In FIG. 1, the termination resistor is connected to the transfer line that transfers a data signal DQ. However, the termination resistor may be further connected to the transfer line that transfers other signals (for example, the address signals, the command signals, etc.).

The data driver 1120 provides the first and second memory chips 1210 and 1220 with the data signals DQ or receives the data signals DQ from the first and second memory chips 1210 and 1220 to read or write the data. The first and second ODT units 1213 and 1223 included in the first and second memory chips 1210 and 1220 are connected to a bus that transfers the data signal DQ, and thus, perform terminations of the data signals DQ input into the first and second memory chips 1210 and 1220.

Detailed operations relating to the termination operation in the memory system 1000 having the above described structure will be described as follows. For convenience of description, one memory chip (for example, the first memory chip 1210) will be described.

A first ODT unit 1213 may include the termination resistor and a switch unit (not shown). The first ODT control signal receiver 1214 receives the first ODT control signal ODTC_0 from the termination controller 1110 of the memory controller 1100, and the switch of the first ODT unit 1213 is turned on/off in response to the first ODT control signal ODTC_0. According to the turning on/off of the switch of the first ODT unit 1213, the termination operation is controlled. For example, when the switch is turned on, the termination resistance component is provided to the transfer line that transfers the data signal DQ and when the switch is turned off, provision of the termination resistance component is blocked.

The termination operation may be controlled based on the memory operation of the first memory chip 1210. For example, when data is written in the first memory chip 1210, reflection of the signal is prevented by providing the input terminal of the data input buffer 1211 with the termination resistance component of the first ODT unit 1213. On the other hand, when the data in the first memory chip 1210 is read, the switch unit of the first ODT unit 1213 is turned off.

The second memory chip 1220 also includes a structure that is substantially the same as that of the first memory chip 1210. The second ODT unit 1223 includes the termination resistor and the switch unit, and the second ODT control signal receiver 1224 receives the second ODT control signal ODTC_1 from the termination controller 1110 of the memory controller 1100. The switch unit of the second ODT unit 1223 is turned on/off in response to the second ODT control signal ODTC_1.

The first and second memory chips 1210 and 1220 respectively include a plurality of pads for receiving signals transferred through the plurality of pins 1310, 1320, and 1330. For example, the pin 1330 is shared by the first and second memory chips 1210 and 1220, the first memory chip 1210 transmits/receives the data signal DQ via the pad PAD1, and the second memory chip 1220 transmits/receives the data signal DQ via the pad PAD3. In addition, the first and second ODT control signals ODTC_0 and ODTC_1 are respectively transferred through separate control signal pins 1310 and 1320, the first memory chip 1210 receives the first ODT control signal ODTC_0 via the pad PAD2, and the second memory chip 1220 receives the second ODT control signal ODTC_1 via the pad PAD4.

Operations of the memory system 1000 shown in FIG. 1 will be described in more detail as follows.

The termination controller 1110 generates the first and second ODT control signals ODTC_0 and ODTC_1 so as to separately control the first and second ODT units 1213 and 1223. For example, when one of the first and second ODT units 1213 and 1223 is activated, the other is deactivated. Activation of an ODT unit denotes controlling the state, i.e., turning on/off, of the ODT unit according to a memory operation, and the deactivation of the ODT unit denotes turning off the ODT unit regardless of a memory operation.

For example, when the second ODT unit 1223 of the second memory chip 1220 is deactivated, the second ODT control signal ODTC_1 is provided to the second memory chip 1220 at a second level, e.g., logic low level, during the entire deactivation period. In another example, when the first ODT unit 1213 of the first memory chip 1210 is activated, the turning on/off of the first ODT unit 1213 is controlled according to the memory operation of the first and second memory chips 1210 and 1220. In detail, for example, when the data signal DQ for the writing operation is provided to at least one of the first and second memory chips 1210 and 1220, the first ODT unit 1213 may be in the turned on state. The termination resistance components of the first ODT unit 1213 are electrically connected to the input terminal of the data input buffer 1221 of the second memory chip 1220 via the pads PAD1 and PAD3 and the bonding wire. Accordingly, the termination of the data signal DQ provided to the second memory chip 1220 is performed.

Figure 2A:
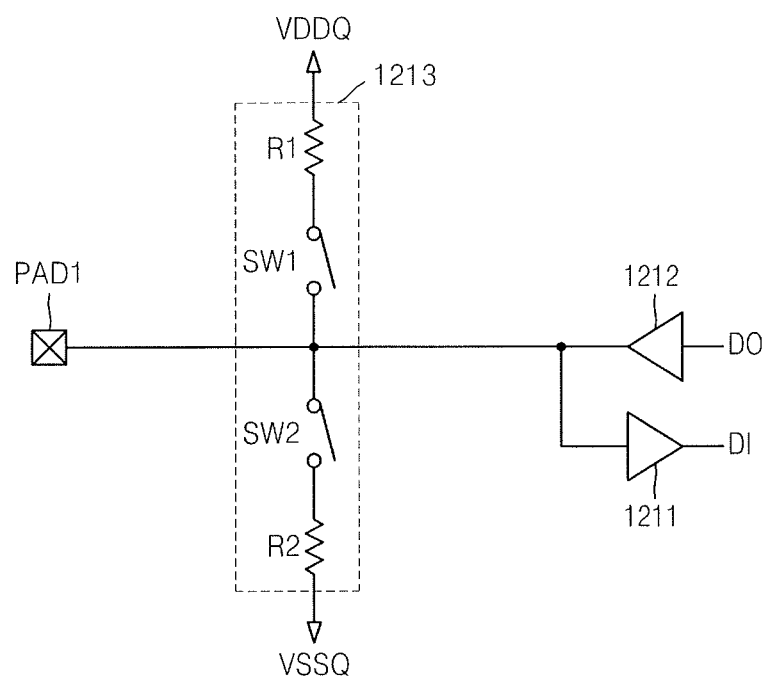
FIGS. 2A through 2C illustrate different configurations of circuit diagrams of an ODT unit of FIG. 1.
Figure 2B:
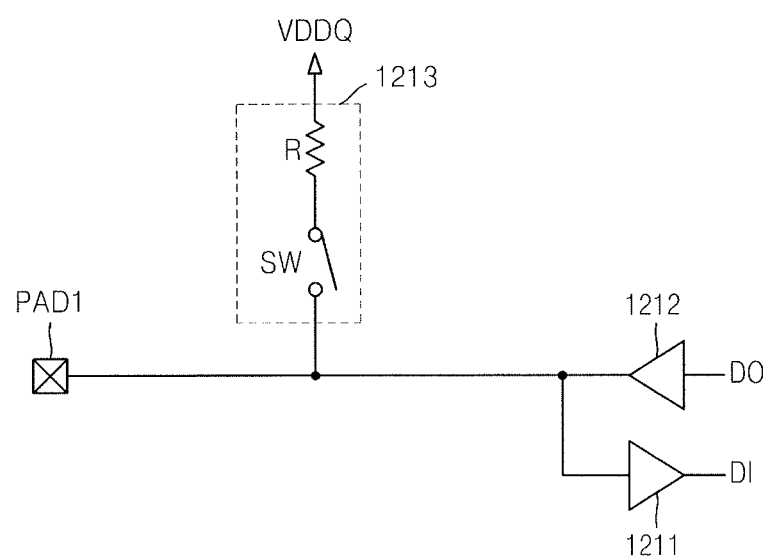
Figure 2C:
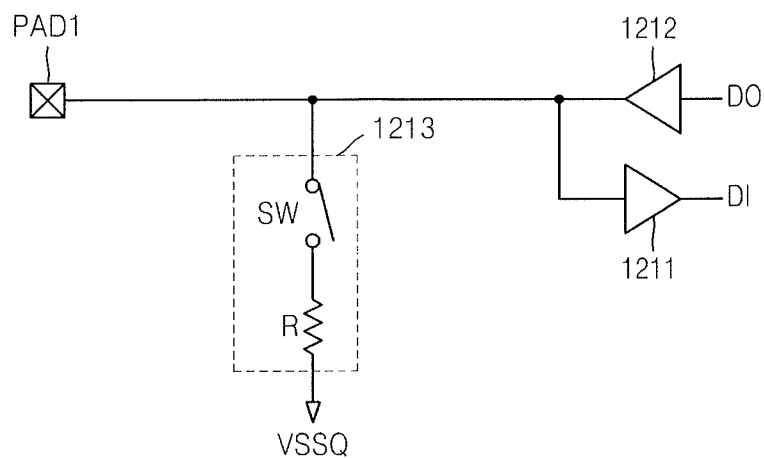

FIGS. 2A through 2C are circuit diagrams of the first and second ODT units 1213 and 1223 shown in FIG. 1. For convenience of the description, an example of configuring the first ODT unit 1213 included in the first memory chip 1210 will be described as follows.

FIG. 2A illustrates an example of a center tap termination method. When the data signal DQ is provided to the data input buffer 1211 via the pad PAD1, the termination resistor of the first ODT unit 1213 may be connected to the input terminal of the data input buffer 1211. In detail, referring to FIG. 2A, the first ODT unit 1213 may include a plurality of termination resistors, e.g., first and second termination resistors R1 and R2, and a plurality of switch units, e.g., first and second switch units SW1 and SW2. For example, a terminal of the first termination resistor R1 may be connected to a power source voltage VDDQ and the other terminal of the first termination resistor R1 may be connected to the input terminal of the data input buffer 1211. A terminal of the second termination resistor R2 may be connected to a ground voltage VSSQ and the other terminal of the second termination resistor R2 may be connected to the input terminal of the data input buffer 1211.

In addition, the first switch unit SW1 is connected between the first termination resistor R1 and the input terminal of the data input buffer 1211, and the second switch unit SW2 is connected between the second termination resistor R2 and the input terminal of the data input buffer 1211. The first and second switch units SW1 and SW2 are switched in response to the first ODT control signal ODTC_0 shown in FIG. 1, so the first and second termination resistors R1 and R2 are connected to or disconnected from the input terminal of the data input buffer 1211 via the respective switch units SW1 and SW2.

FIG. 2B illustrates an example of a power source voltage VDDQ termination method. Referring to FIG. 2B, the first ODT unit 1213 may include a termination resistor R and a switch unit SW connected between the power source voltage VDDQ and the input terminal of the data input buffer 1211. Alternatively, FIG. 2C illustrates an example of a ground voltage VSSQ termination method, where the first ODT unit 1213 may include the termination resistor R and the switch unit SW connected between the ground voltage VSSQ and the data input buffer 1211.

Referring to FIGS. 2B and 2C, when the data input buffer 1211 is a differential input type buffer, i.e., receives the data signal and a predetermined reference signal (not shown), the predetermined reference signal level may vary depending on the termination method. For example, when the termination method shown in FIG. 2B is applied, a voltage level of the transfer line that transfers the data signal DQ has a relatively high value, and accordingly, the reference signal may also have a relatively high level, e.g., a voltage level between VDDQ and VDDQ/2. However, when the termination method shown in FIG. 2C is applied, the reference signal may have a relatively low level, e.g., a voltage level between VDDQ/2 and the ground voltage VSSQ.

FIGS. 2A through 2C show one termination resistor and one switch unit between the voltage signal (VDDQ or VSSQ) and the data input buffer. However, the embodiment of the present inventive concept is not limited thereto. For example, a plurality of termination resistors and a plurality of switch units may be connected between one voltage signal and the data input buffer, and one or more termination resistance components may be provided to the input terminal of the data input buffer based on the control operations of the switches.

Figure 3:
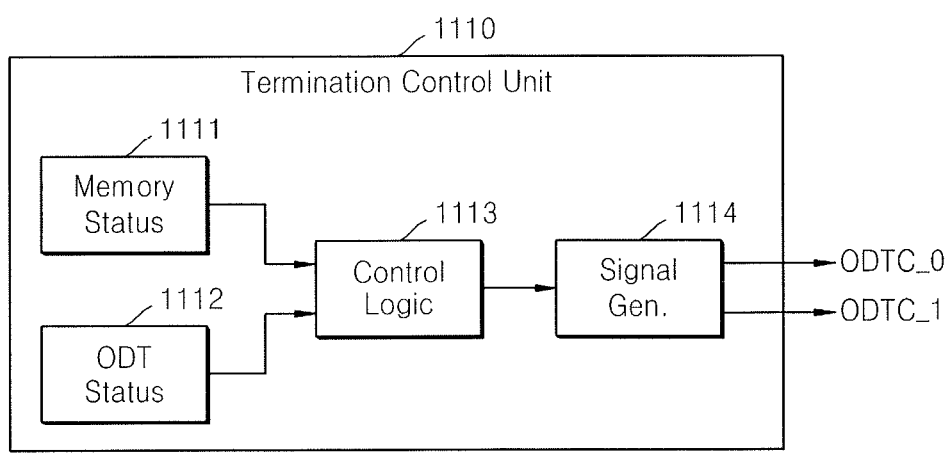
FIG. 3 illustrates a detailed block diagram of a termination controller shown in FIG. 1.
Figure 4:
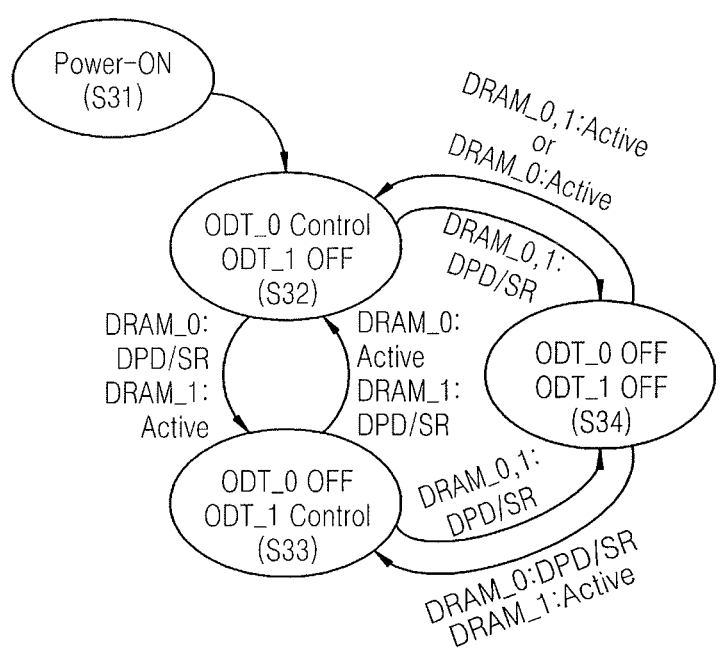
FIG. 4 illustrates a flowchart of controlling the ODT unit shown in FIG. 1.

FIG. 3 is a block diagram of a termination controller 1110 of FIG. 1, and FIG. 4 is a flowchart of controlling the first and second ODT units 1213 and 1223 of FIG. 1.

Referring to FIGS. 1 through 3, the termination controller 1110 may include a memory status determination unit 1111, an ODT status determination unit 1112, a control logic unit 1113, and an ODT control signal generator 1114.

The memory status determination unit 1111 determines operating states of the first and second memory chips 1210 and 1220 included in the semiconductor memory device 1200. For example, the first and second memory chips 1210 and 1220 may be in activation states for performing a reading or writing operation, or may be in deactivation states, such as an idle time, a refresh mode, and a deep power down.

The ODT status determination unit 1112 determines the state of each of the first and second ODT units 1213 and 1223 of the first and second memory chips 1210 and 1220. For example, the ODT status determination unit 1112 determines whether the first ODT unit 1213 of the first memory chip 1210 is activated and whether the second ODT unit 1223 of the second memory chip 1220 is activated.

The control logic unit 1113 receives the determination results of the status of the first and second memory chips 1210 and 1220, and the determination results of activations of the first and second ODT units 1213 and 1223, and generates an internal signal relating to controlling the first and second ODT units 1213 and 1223 based on the received results. In addition, when the semiconductor memory device 1200 is initially driven, information regarding the first and second memory chips 1210 and 1220 included in the semiconductor memory device 1200 may be provided to the memory controller 1100, and the control logic unit 1113 selects one of the memory chips 1210 and 1220 as a representative memory chip with reference to the information and activates the ODT unit included in the selected representative memory chip. During controlling of the ODT unit of the representative memory chip, another memory chip may be re-selected as the representative memory chip based on the determination results of the memory operating states and the activation states of the ODT unit, and the ODT unit of the representative memory chip is activated to control the turning on/off operations.

The ODT control signal generator 1114 generates the first and second ODT control signals ODTC_0 and ODTC_1 in response to the internal signal generated by the control logic unit 1113, and provides the generated first and second ODT control signals ODTC_0 and ODTC_1 to the first and second memory chips 1210 and 1220.

Referring to FIGS. 1 through 4, when the semiconductor memory device 1200 is turned on, the ODT unit in one of the memory chips included in the semiconductor memory device 1200 may be activated. For example, as shown in FIG. 4, when power is applied to the semiconductor memory device 1200 (operation S31), the first ODT unit 1213 included in the first memory chip 1210 may be activated, i.e., state of unit ODT_0 is turned on, and the second ODT unit 1223 included in the second memory chip 1220 may be deactivated, i.e., state of unit ODT_1 is tuned off, (operation S32). In addition, the first ODT unit (ODT_0) 1213 is controlled according to the input/output of the data signal DQ so that the termination operation of the data signal DQ may be performed. That is, the second ODT unit (ODT_1) 1223 is always turned off, and the first ODT unit (ODT_0) 1213 is turned on/off according to the operations of the first and second memory chips 1210 and 1220, e.g., the second ODT unit 1223 is turned off while the first ODT 1213 is turned on when either of the first and second memory chips 1210 and 1220 performs operations.

When the status of the first memory chip 1210 enters a predetermined mode, e.g., when the first memory chip 1210 is in a self-refresh (SR) mode or in a deep power down (DPD) mode, the first ODT unit (ODT_0) 1213 is deactivated and the second ODT unit (ODT_1) 1223 is activated (operation S33). Turning on/off of the second ODT unit (ODT_1) 1223 is controlled according to the data signal DQ input/output into/from the semiconductor memory device 1200.

When both the first memory chip 1210 and the second memory chip 1220 are in the SR mode or the DPD mode states, the first and second ODT units (ODT_0 and ODT_1) 1213 and 1223 are deactivated (operation S34). Then, when one of the first and second memory chips 1210 and 1220 is activated, the ODT unit in the activated memory chip is activated, and the ODT unit in the other memory chip is maintained in a deactivated state. For example, when the first memory chip 1210 is activated, as described in operation S32, the first ODT unit (ODT_0) 1213 is activated, and the turning on/off of the first ODT unit (ODT_0) 1213 is controlled according to the input/output of the data signal DQ in the semiconductor memory device 1200, while the second ODT unit (ODT_1) 1223 is maintained in a deactivated state. In another example, the first and second memory chips 1210 and 1220 may be activated simultaneously, and the ODT unit in only one of the activated memory chips 1210 and 1220 may be arbitrarily activated. For example, as illustrated in FIG. 4, when the first and second memory chips 1210 and 1220 are simultaneously activated, the first ODT unit (ODT_0) 1213 may be activated.

That is, the memory controller 1100 provides a plurality of memory chips, i.e., the first and second memory chips 1210 and 1220, with a shared pin 1330, so data may be transmitted commonly to all memory chips, and a method of separately controlling the ODT units (ODT_0 and ODT_1) of the different memory chips, e.g., via the pins 1310 and 1320. For example, the first and second ODT control signals ODTC_0 and ODTC_1 are independently provided to the first and second memory chips 1210 and 1220 through separate paths, e.g., via the pins 1310 and 1320, so each of the ODT units (ODT_0 and ODT_1) may be independently controlled. According to the embodiment of the present inventive concept, a method of controlling the ODT units (ODT_0 and ODT_1) in other states besides the DPD mode and the SR mode may be provided.

Figure 5A:
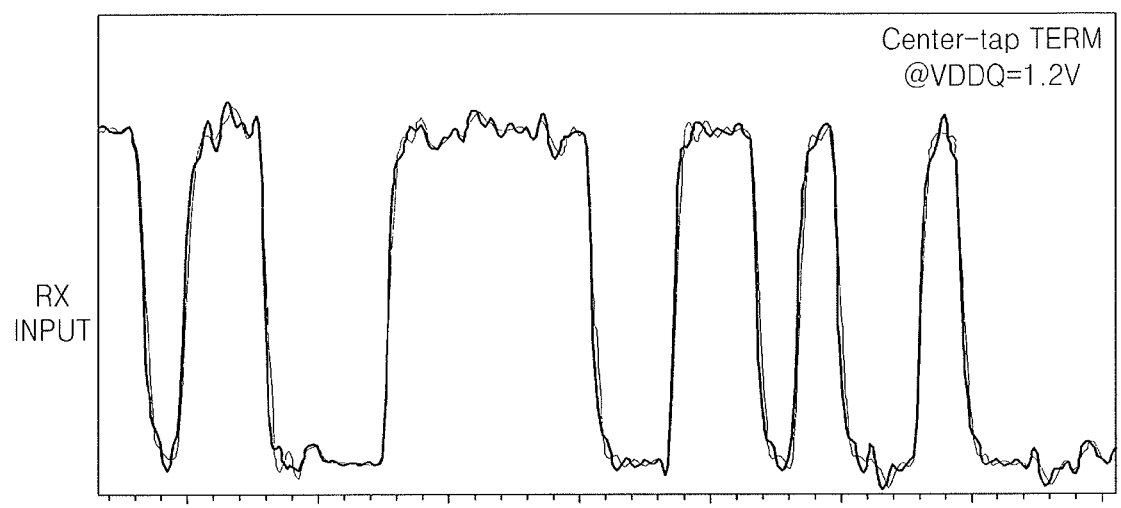
FIGS. 5A and 5B illustrate waveform diagrams of a data signal measured by a data input buffer shown in FIG. 1 and a comparative memory device, respectively.
Figure 5B:
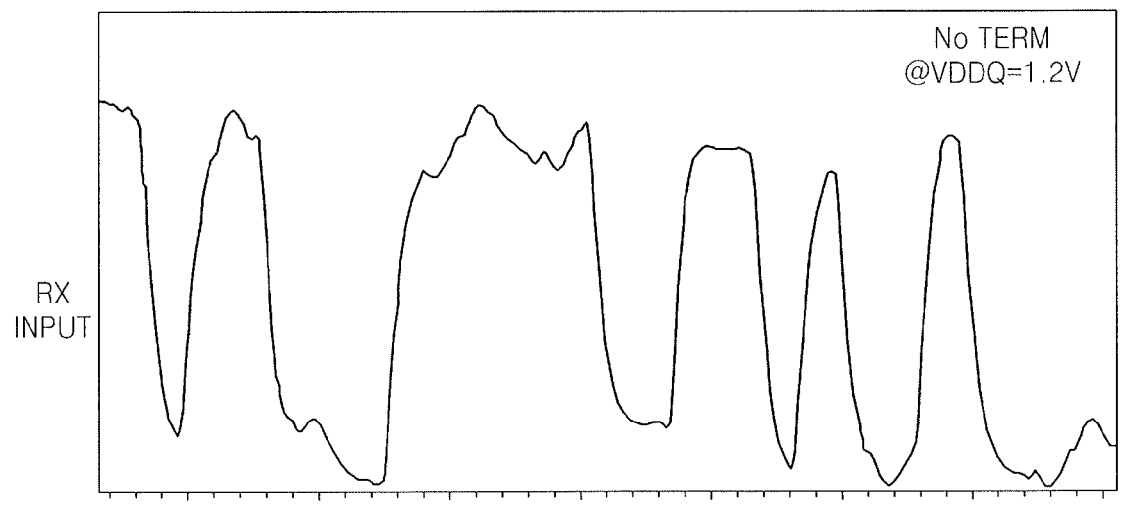

FIGS. 5A and 5B are waveform diagrams of data signals measured at the data input buffers 1211 and 1221 of FIG. 1. Referring to FIGS. 1, 4, 5A, and 5B, the semiconductor memory device 1200 includes the first and second memory chips 1210 and 1220 that are arranged to be stacked and to share one pin 1330. According to the semiconductor memory device 1200 of the present embodiment, the ODT unit in one of the memory chips may be activated, and the ODT unit in the other memory chip may be deactivated. For example, the first ODT unit 1213 of the first memory chip 1210 may be activated, and the second ODT unit 1223 of the second memory chip 1220 may be deactivated.

FIG. 5A is a graph showing a waveform of the data signal provided to the input terminals of the data input buffers 1211 and 1221 in the first and second memory chips 1210 and 1220, when the first and second ODT units 1213 and 1223 are controlled according to the embodiment of the present inventive concept. When the data signal is input in the semiconductor memory device 1200, the first ODT unit 1213 of the first memory chip 1210 is turned on, the waveform at the input terminal of the data input buffer 1211 in the first memory chip 1210 and the waveform at the input terminal of the data input buffer 1221 of the second memory chip 1220 are nearly the same as each other. On the other hand, FIG. 5B shows the waveform of the data signal provided to the input terminal of the data input buffers 1211 and 1221 of the first and second memory chips 1210 and 1220 when the ODT units are not provided in the first and second memory chips 1210 and 1220.

Referring to the waveforms of the data signals received through the data input buffers 1211 and 1221 in the first and second memory chips 1210 and 1220 shown FIGS. 5A and 5B, even though only the first ODT unit 1213 of the first memory chip 1210 is activated, the waveform of the data signal at the data input buffer 1221 of the second memory chip 1220 is similar to, i.e., almost the same as, the waveform of the data signal measured at the first memory chip 1210. That is, since the pads of the first and second memory chips 1210 and 1220, which receive the data signals, are connected to each other through the bonding wire, and since the bonding wire has a very small resistance component, there is little channel loss or channel reflection effect. Therefore, the input waveforms of the data signals input into the first and second memory chips 1210 and 1220 through the connected pads of the first and second memory chips 1210 and 1220 may be nearly the same as each other.

In addition, according to the results, the waveform in a memory chip according to example embodiments (FIG. 5A) is improved when comparing with that of memory chips without ODT units (FIG. 5B). That is, according to the embodiment of the present inventive concept, degradation of signal integrity caused by a skew between turning on/off timings of the plurality of ODT units or a change in an ODT equivalent resistance value due to different operating states of the chips may be prevented, and fluctuation of the signal may be reduced less than that of a case where the ODT units are not provided in the memory chips.

Figure 6:
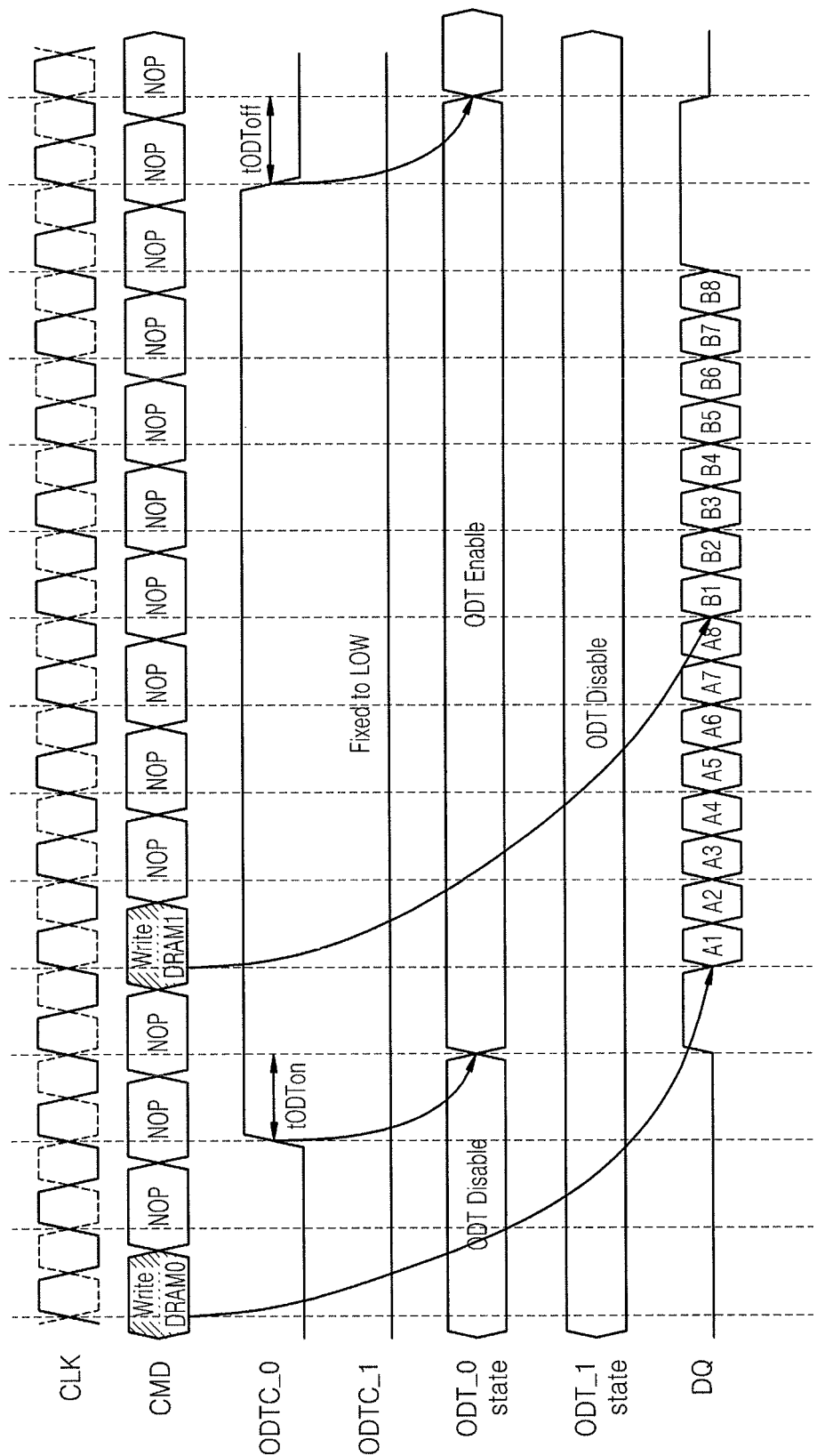
FIG. 6 illustrates a timing diagram showing controlling of an ODT unit according to a memory operation in the semiconductor memory device of FIG. 1 according to an embodiment.

FIG. 6 is a timing diagram showing controlling of an ODT unit according to operations of the memory in the semiconductor memory device 1200 of FIG. 1, according to an embodiment of the present inventive concept. In FIG. 6, the turning on/off of the first ODT unit 1213 is controlled, and the second ODT unit 1223 is deactivated.

Referring to FIGS. 1 and 6, the memory controller 1100 outputs a write command (Write DRAM0) for writing data in the first memory chip 1210, and the first ODT control signal ODTC_0 is converted from a low level to a high level to be provided to the first ODT control signal receiver 1214. The first ODT control signal ODTC_0 is provided to the switch unit (not shown) in the first ODT unit 1213, and when the switch unit is turned on (ON), the termination resistance component is provided to the input terminal of the data input buffer 1211. After that, data signals A1 through A8 are input into the first memory chip 1210.

When the memory controller 1100 outputs a write command (Write DRAM1) for writing data in the second memory chip 1220, the first ODT control signal ODTC_0 is maintained in the high level, and the switch unit (not shown) in the first ODT unit 1213 is maintained in the turned on (ON) status in response to the first ODT control signal ODTC_0. While the first ODT unit 1213 is in the turned-on status, data signals B1 through B8 to be written in the second memory chip 1220 are provided to the semiconductor memory device 1200. That is, the first ODT unit 1213 is in the turned-on status, i.e., ODT_0 state is enabled, during data writing into both the first and second memory chips 1210 and 1220, while the second ODT unit 1223 is in the turned-off status, i.e., ODT_1 state is disabled, by providing a constant low level ODT control signal ODTC_1.

During the writing of the data signals A1 through A8 and B1 through B8 in the first and second memory chips 1210 and 1220, the second ODT control signal ODTC_1 maintained at the low level is provided to the second ODT control signal receiver 1224 to turn off the switch unit (not shown) in the second ODT unit 1223. Accordingly, the second ODT unit 1223 is maintained in a deactivated state when data is written into the first and second memory chips 1210 and 1220.

That is, during receipt of data from outside, one ODT unit is deactivated regardless of the memory chip in which the data is to be written. In other words, a same ODT unit is used when writing data into the different memory chips, thereby eliminating turning on/off different ODT units when using a plurality of memory chips. Thus, degradation of signal integrity caused by a skew between a plurality of ODT units and a change of an ODT equivalent resistance value due to the different operating states of the chips may be prevented.

Figure 7:
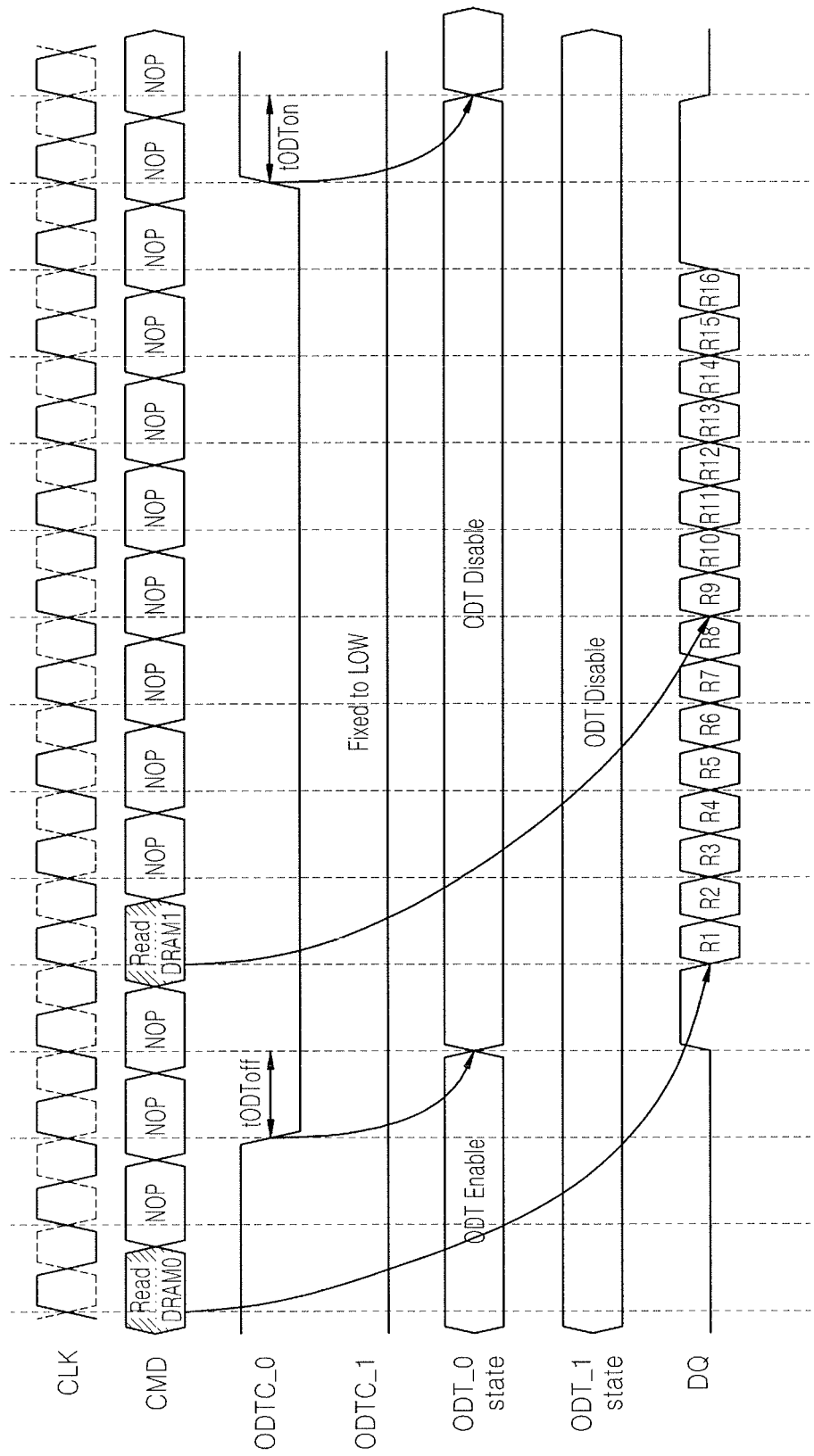
FIG. 7 illustrates a timing diagram showing controlling of an ODT unit in the semiconductor memory device of FIG. 1 according to another embodiment.

FIG. 7 is a timing diagram showing controlling of ODT unit in the semiconductor memory device 1200 of FIG. 1, according to another embodiment of the present inventive concept. 1. It is noted that FIG. 6 shows an example of controlling the turning on/off of the ODT units based on the writing command for writing the data as in a memory type of DDR3, while FIG. 7 shows an example of controlling the turning on/off of the ODT unit based on a reading command for reading the data as in a memory type of a graphic DDR (GDDR).

As shown in FIGS. 1 and 7, when power is applied to the semiconductor memory device 1200, the ODT unit in one of the memory chips (for example, the first memory chip 1210) is activated, and the ODT unit (the second ODT unit 1223) of the other memory chip (for example, the second memory chip 1220) is deactivated. The turning on/off of the first ODT unit 1213 is controlled by memory operation, and the first ODT unit 1213 is maintained in the turned on status usually and is changed into the turned off status when the data reading operation is performed.

The memory controller 1100 outputs a reading command (Read DRAM0) for reading data in the first memory chip 1210, and at the same time, changes the level of the first ODT control signal ODTC_0 for controlling the first ODT unit 1213 of the semiconductor memory device 1200. For example, the first ODT control signal ODTC_0 having the logic low level is provided to the first ODT unit 1213 during the reading operation, and accordingly, the first ODT unit 1213 is changed into the turned off status. When the reading operations of the first and second memory chips 1210 and 1220 are successively performed, a reading command (Read DRAM1) for reading the data from the second memory chip 1220 is provided to the semiconductor memory device 1200, and the first ODT control signal ODTC_0 is maintained at the logic low level during the reading operations of the first and second memory chips 1210 and 1220. After data R1 through R8 and R9 through R16 are read from the first and second memory chips 1210 and 1220, the first ODT unit 1213 is controlled to be in the turned on status again.

Although not shown in FIGS. 6 and 7, if the first memory chip 1210 is not controlled because the first memory chip 1210 enters the SR mode or the DPD mode, the memory controller 1100 controls the first ODT unit 1213 to be in the deactivated state and the second ODT unit 1223 to be in the activated state. In addition, the turning on/off operations of the second ODT unit 1223 may be controlled according to the memory operations shown in FIGS. 6 and 7. Also, FIGS. 6 and 7 show examples of controlling the first and second ODT units 1213 and 1223 based on writing/reading commands. However, the present inventive concept is not limited thereto. For example, when the first and second memory chips 1210 and 1220 receive predetermined signals through a common terminal (or pin) of the semiconductor memory device 1200 and the ODT unit is applied to the transfer line that transfers the predetermined signals, the activation/deactivation and the turning on/off of the ODT unit may be controlled based on the receipt of the predetermined signals.

Figure 8:
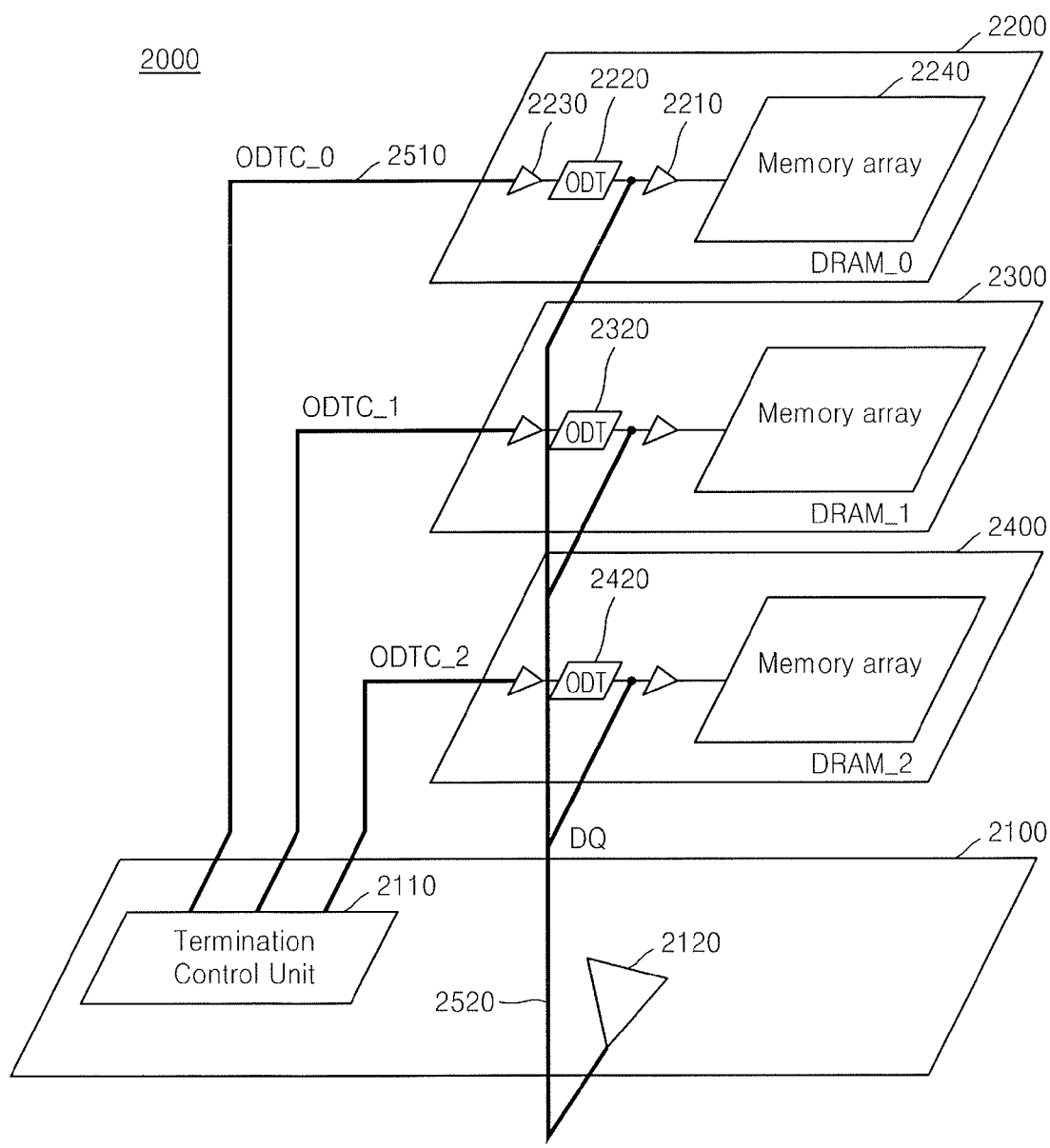
FIG. 8 illustrates a block diagram of a semiconductor memory device according to another embodiment.

FIG. 8 is a block diagram of a semiconductor memory device 2000 according to another embodiment of the present inventive concept. Referring to FIG. 8, the semiconductor memory device 2000 may include a plurality of layers 2200, 2300, and 2400, in which memory arrays are disposed, or may include a plurality of layers 2200, 2300, and 2400, and a memory controller 2100 on which various control circuits for driving the memory arrays are disposed. The layers 2200, 2300, and 2400 including the memory arrays may be packaged as one semiconductor memory device, and each of the layers 2200, 2300, and 2400 may be in a wafer level or a chip level. When the layers 2200, 2300, 2400, and the memory controller 2100 are stacked together as a package, the semiconductor memory device 2000 may realize a memory system.

Detailed operations of the semiconductor memory device 2000 of FIG. 8 having the above structure are as follows. It is assumed that each of the layers 2200, 2300, and 2400 is a memory chip, e.g., a DRAM, and it is also assumed that the layers 2200, 2300, 2400, and the memory controller 2100 are disposed in the semiconductor memory device 2000. It is noted that hereinafter "layers" 2200, 2300, 2400 and "memory chips" 2200, 2300, 2400 may be used interchangeably.

Each of memory chips 2200, 2300, and 2400 (hereafter, first, second, and third memory chips) may include a memory array and an ODT unit. For example, as shown in FIG. 8, the first memory chip 2200 may include a data input buffer 2210, a first ODT unit 2220, an ODT control signal receiver 2230, and a memory array 2240.

The memory controller 2100 may include a termination controller 2110 and a data driver 2120. When performing a data write operation, the data driver 2120 transfers data signals DQ to the first, second, and third memory chips 2200, 2300, and 2400. Here, the first, second, and third memory chips 2200, 2300, and 2400 may share a transfer line 2520 that transfers the data signals DQ. Each of the first, second, and third memory chips 2200, 2300, and 2400 receives a chip selecting signal (not shown) provided from the memory controller 2100, and the memory chip that will perform the writing/reading operations is selected according to the chip selecting signal.

The termination controller 2110 provides first, second, and third ODT control signals ODTC_0, ODTC_1, and ODTC_2 to the first, second, and third memory chips 2200, 2300, and 2400 so as to control activation/deactivation of first, second, and third ODT units 2220, 2320, and 2420 included in the first, second, and third memory chips 2200, 2300, and 2400, respectively. At this time, since the first, second, and third ODT control signals ODTC_0, ODTC_1, and ODTC_2 are separately connected, turning on/off operations of the first, second, and third ODT units 2220, 2320, and 2420 in the first, second, and third memory chips 2200, 2300, and 2400 may be independently controlled according to the memory operations.

Figure 9:
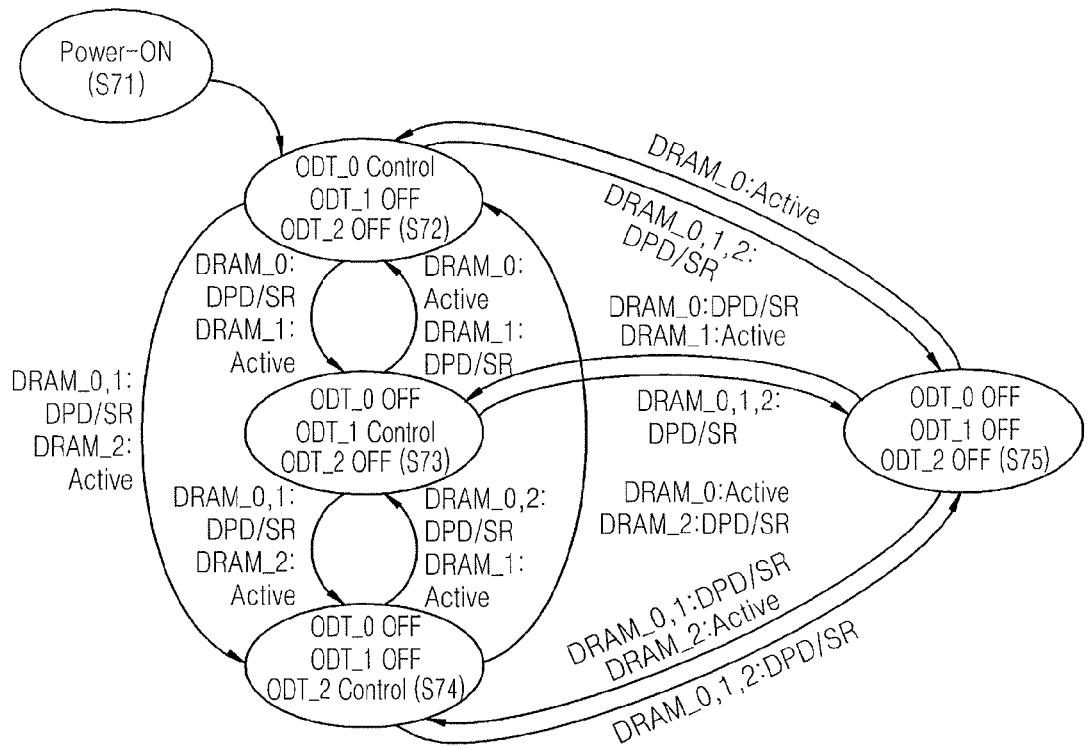
FIG. 9 illustrates a flowchart of controlling an ODT unit in the semiconductor memory device of FIG. 8.

FIG. 9 is a flowchart of controlling an ODT unit in the semiconductor memory device 2000 of FIG. 8. Referring to FIGS. 8 and 9, when power is applied to the semiconductor memory device 2000 (operation S71), the first ODT unit 2220 included in the first memory chip 2200 is initially activated, and the second and third ODT units 2320 and 2420 included in the second and third memory chips 2300 and 2400 are deactivated (operation S72). The termination controller 2110 controls the turning on/off states of the first ODT unit 2220 according to the input/output of the data signal into/from the semiconductor memory device 2000.

When the state of the first memory chip 2200 enters the SR mode or the DPD mode, the first ODT unit 2220 is deactivated, and another ODT unit (for example, the second ODT unit 2320 of the second memory chip 2300) may be activated (operation S73). When the first and second memory chips 2200 and 2300 enter the SR mode or the DPD mode, the first and second ODT units 2220 and 2320 are deactivated, and the third ODT unit 2420 is activated (operation S74). When the first, second, and third memory chips 2200, 2300, and 2400 enter the SR mode or the DPD mode, the first, second, and third ODT units 220, 2320, and 2420 are all deactivated (operation S75).

That is, the memory controller 2100 provides a method of controlling an ODT unit through an ODT control pin in the plurality of memory chips sharing the data pin of the semiconductor memory device 2000. According to the embodiment of the present inventive concept, a method of controlling the ODT unit in other states than the DPD mode and the SR mode may be provided. According to another embodiment of the present inventive concept, the number of memory chips packaged in the semiconductor memory device 2000 may be three or more.

Figure 10:
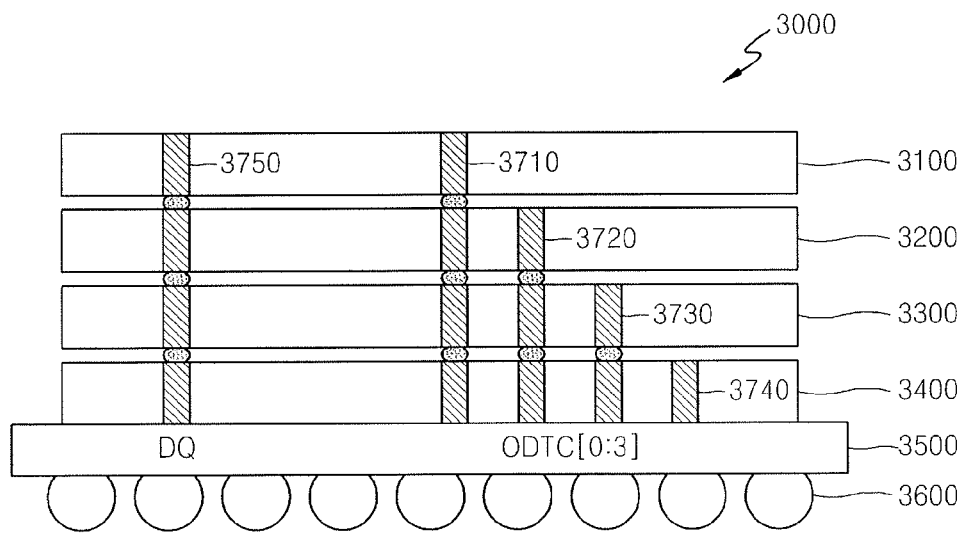
FIG. 10 illustrates a cross-sectional view of a semiconductor memory device according to an embodiment.

FIG. 10 is a cross-sectional view of a semiconductor memory device 3000 according to an embodiment of the present inventive concept. Referring to FIG. 10, the semiconductor memory device 3000 includes a substrate 3500, and a plurality of semiconductor chips 3100 through 3400 mounted on a surface of the substrate 3500. Each of the semiconductor chips 3100 through 3400 may be a memory chip including a memory array, or one of the semiconductor chips 3100 through 3400 may be a memory controller including a control circuit for controlling the memory arrays.

The semiconductor chips 3100 through 3400 may respectively include TSVs 3710 through 3750. Each of the TSVs 3710 through 3750 may be formed by penetrating a part of or an entire depth of the semiconductor chips 3100 through 3400, and the semiconductor chips 3100 through 3400 may be electrically connected to each other via the TSVs 3710 through 3750. For example, the TSVs may transfer signals between an upper chip and a lower chip.

The TSVs 3710 through 3750 include a first transfer line 3750 that transfers input/output data signals DQ, and second transfer lines 3710 through 3740 that transfer ODT control signals ODTC_0 through ODTC_3. Here, the semiconductor chips 3100 through 3400 may share the first transfer line 3750. Accordingly, the semiconductor chips 3100 through 3400 transfer/receive input/output data signals through a common path. When two or more data signals are transferred/received in parallel with each other through a plurality of channels, the first transfer line 3750 may include a plurality of TSVs.

On the other hand, the semiconductor chips 3100 through 3400 respectively receive the ODT control signals ODTC_0 through ODTC_3 through separate second transfer lines 3710 through 3740, respectively. That is, each of the semiconductor chips 3100 through 3400 receives its corresponding ODT control signal, i.e., one of the OCT control signals ODTC_0 through ODTC_3, through a separate second transfer line, i.e., one of the second transfer lines 3710 through 3740. For example, the second transfer line 3710 connected to the semiconductor chip 3100 may transfer, e.g., only, the ODT control signal ODTC_0, so the turning on/off operations of the ODT unit (not shown) in the semiconductor chip 3100 may be controlled in response to the ODT control signal ODTC_0. Operations of the ODT unit in the semiconductor memory device 3000 of FIG. 10 may be controlled based on the flowchart of FIG. 9. That is, the ODT unit in one of the semiconductor chips of the semiconductor memory device 3000 is activated, and the ODT units in other semiconductor chips are deactivated. In addition, turning on/off of the activated ODT unit is controlled based on the memory operations (for example, input and/or output of the data signals) of the semiconductor memory device 3000. When the ODT unit is turned on, the termination resistance value is provided to the first transfer line 3750.

Figure 11:
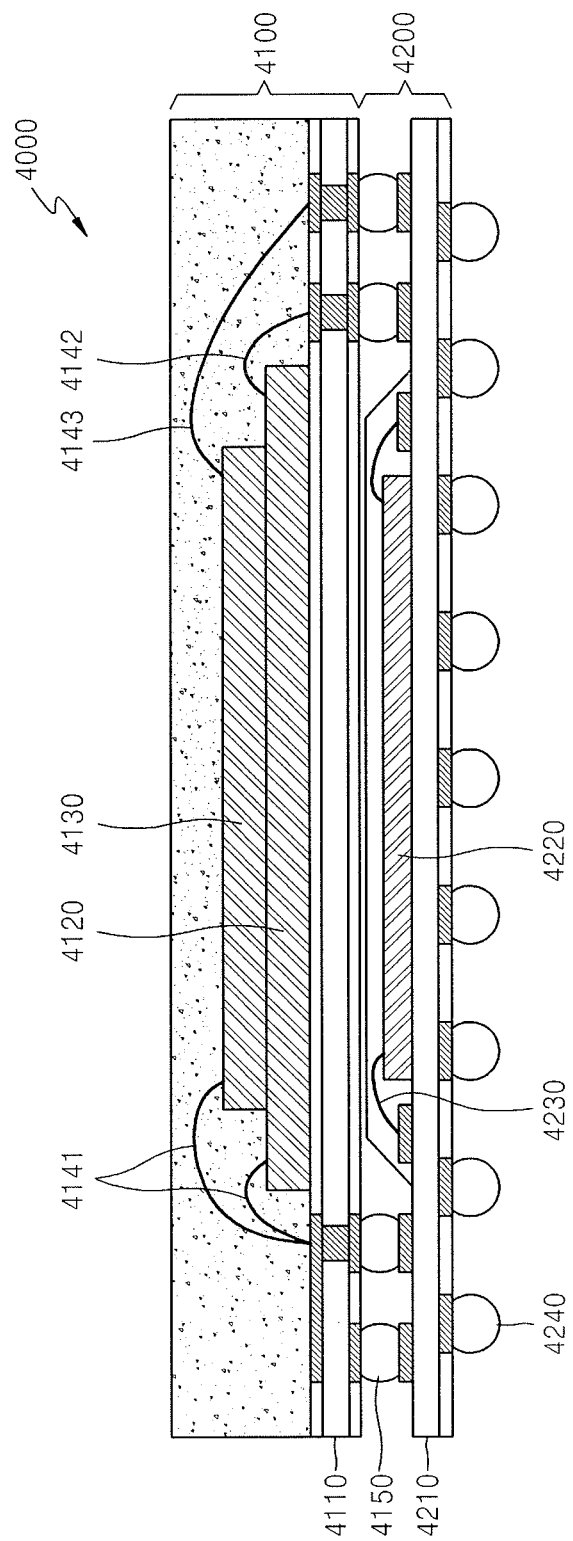
FIG. 11 illustrates a cross-sectional view of a semiconductor memory device according to another embodiment.

FIG. 11 is a cross-sectional view of a semiconductor memory device 4000 according to another embodiment. FIG. 11 illustrates the semiconductor memory device 4000 configured as a package on package (PoP).

Referring to FIG. 11, the semiconductor memory device 4000 includes an upper package 4100 and a lower package 4200. The upper package 4100 includes a first printed circuit board (PCB) 4110 and semiconductor chips 4120 and 4130. The first PCB 4110 and the semiconductor chips 4120 and 4130 are electrically connected to each other through a plurality of conductive lines 4141 through 4143. The conductive lines 4141 through 4143 may be bonding wires, and the conductive lines 4141 that transfer data signals to each of the semiconductor chips 4120 and 4130 are connected commonly to a terminal (or pin) of the semiconductor memory device 4000. Accordingly, pads (not shown) for transferring the data signals in the semiconductor chips 4120 and 4130 are electrically connected to each other through the bonding wire. The bonding wire has a very small resistance, and thus, there is little channel loss or channel reflection effect.

The plurality of semiconductor chips 4120 and 4130 may each include a memory chip including a dynamic memory, e.g., a DRAM, a flash memory, e.g., a NAND and a NOR, and/or a non-volatile memory chip, e.g., a PRAM, a MRAM, and a RRAM. When the semiconductor chips 4120 and 4130 are formed as one package, the conductive lines 4141 that transfer the data signals to the semiconductor chips 4120 and 4130 are connected to a common terminal (or pin). On the other hand, the conductive lines 4142 and 4143 for transferring the ODT control signals to the semiconductor chips 4120 and 4130 are connected to separate terminals (or pins), and accordingly, the ODT units in the semiconductor chips 4120 and 4130 may be separately controlled. The ODT unit in one of the semiconductor chips 4120 and 4130 is activated, and the ODT unit in the other semiconductor chip is deactivated. The turning on/off of the activated ODT unit is controlled based on the memory operation of the semiconductor memory device 4000.

A solder ball 4150 located under the first PCB 4110 may be bonded to a ball land that is formed on an upper portion of the lower package 4200 so as to electrically connect the upper and lower packages 4100 and 4200 to each other.

The lower package 4200 may include a second PCB 4210, a logic chip 4220 including logic circuits, a plurality of conductive lines 4230, and a terminal 4240. The logic chip 4220 may include various logic circuits for controlling the memory operations of the semiconductor chips 4120 and 4130 of the upper package 4100, e.g., a termination controller (not shown) for controlling ODT units (not shown) of the semiconductor chips 4120 and 4130. The conductive lines 4230 may include a plurality of bonding wires for electrically connecting the logic chip 4220 and the second PCB 4210 to each other, and the terminal 4240 provides an interface between the logic chip 4220 and the outside.

Figure 12:
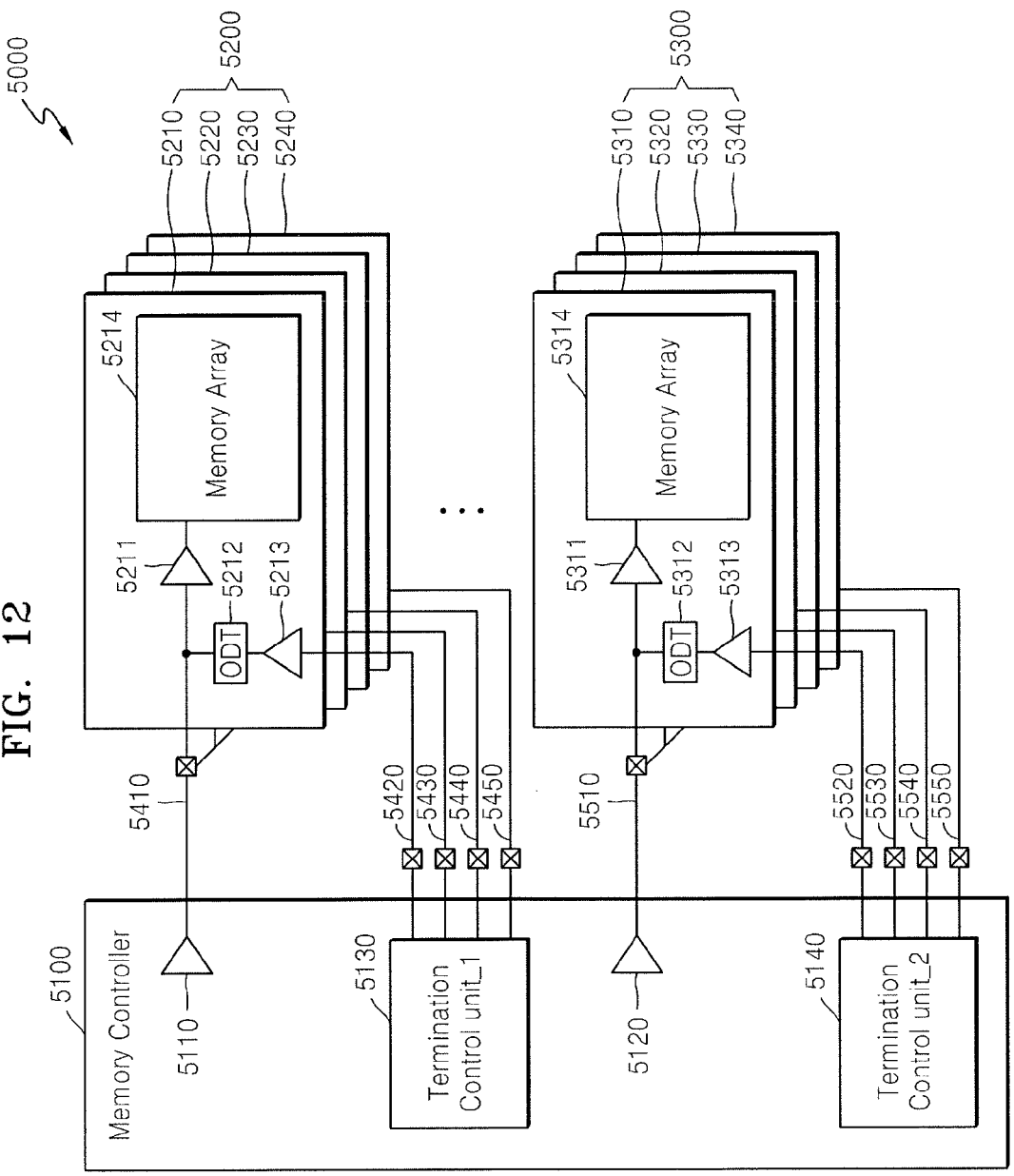
FIG. 12 illustrates a block diagram of a memory system according to another embodiment.

FIG. 12 is a block diagram of a memory system 5000 according to another embodiment. The memory system 5000 may include a memory controller 5100 and a plurality of semiconductor memory devices 5200 and 5300. Each of the semiconductor memory devices 5200 and 5300 may include a plurality of semiconductor chips, e.g., DRAMs, and the semiconductor memory devices 5200 and 5300 may be mounted on a module board (not shown) to realize a memory module. More semiconductor memory devices than the ones stated may be included in the memory system 5000. However, in the present embodiment, it is assumed that two semiconductor memory devices, i.e., the first and second semiconductor memory devices 5200 and 5300, are included in the memory system 5000.

The memory controller 5100 may include a first data driver 5110 and a second data driver 5120, and first and second termination controllers 5130 and 5140. The first data driver 5110 drives input/output data of the first semiconductor memory device 5200 and outputs a data signal through a first data bus 5410. In addition, the second data driver 5120 drives input/output data of the second semiconductor memory device 5300 and outputs a data signal through a second data bus 5510.

The first termination controller 5130 outputs ODT control signals corresponding to semiconductor chips 5210 through 5240 through first ODT control buses 5420 through 5450 in order to control turning on/turning off of ODT units included in the semiconductor chips 5210 through 5240 of the first semiconductor memory device 5200. Likewise, the second termination controller 5140 outputs ODT control signals corresponding to semiconductor chips 5310 through 5340 through second ODT control buses 5520 through 5550 in order to control turning on/off of ODT units included in the semiconductor chips 5310 through 5340 of the second semiconductor memory device 5300.

In FIG. 12, the first and second semiconductor memory devices 5200 and 5300 respectively receive data signals through different data drivers in the memory controller 5100. However, the present inventive concept is not limited thereto, e.g., the data signals may be received through a common data driver of the memory controller 5100.

In addition, when the present embodiment is described based on the first semiconductor memory device 5200, the common data bus, i.e., the first data bus 5410, and a terminal are disposed with respect to the semiconductor chips 5210 through 5240, and the ODT control buses 5420 through 5450 and terminals corresponding to each of the semiconductor chips 5210 through 5240 are disposed. The data signal is provided to a memory array 5214 through the common data bus, i.e., the first data bus 5410, and a data input buffer 5211. However, the ODT control signals are provided to an ODT control signal receiver 5213 and an ODT unit 5212 through a separate ODT control bus, i.e., the first ODT control bus 5420, and the turning on/off of the ODT unit 5212 is controlled by the ODT control signal. In addition, the data signal may be provided to one of the first and second semiconductor memory devices 5200 and 5300, or both of the first and second semiconductor memory devices 5200 and 5300 simultaneously. The activation/deactivation operations and the turning on/off operations of ODT units 5212 and 5312 are controlled by the operating mode of the semiconductor memory devices 5200 and 5300 and the input/output of the data signal.

Figure 13:
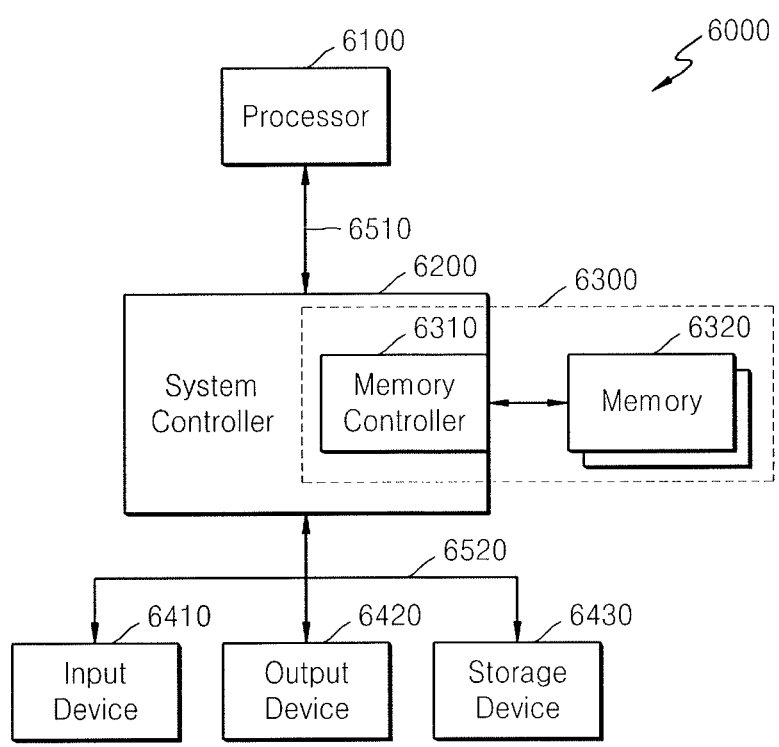
FIG. 13 illustrates a diagram of a computing system including the memory system according to an embodiment.

FIG. 13 is a block diagram of a computing system 6000 including a memory system, according to an embodiment. Referring to FIG. 13, the computing system 6000 may include a processor 6100, a system controller 6200, and a memory system 6300. The computing system 6000 may further include a processor bus 6510, an expansion bus 6520, an input device 6410, an output device 6420, and a storage device 6430. The memory system 6300 may include at least one semiconductor memory device 6320 and a memory controller 6310. Alternatively, the memory controller 6310 may be included in the system controller 6200.

The processor 6100 may execute the computing system 6000 variously, such as an execution of certain software performing calculations or tasks. For example, the processor 6100 may be a micro-processor or a central processing unit (CPU). The processor 6100 may be connected to the system controller 6200 via the processor bus 6510 that includes an address bus, a controlling bus, and/or a data bus. The system controller 6200 may be connected to the expansion bus 6520 such as a peripheral component interconnection (PCI) bus. Accordingly, the processor 6100 may control one or more input apparatuses 6410, e.g., a keyboard or a mouse, one or more output apparatuses 6420, e.g., a printer or a display apparatus, and/or one or more storage devices 6430, e.g., a hard disk drive, a solid state drive, or a CD-ROM, via the system controller 6200.

The memory controller 6310 may control the semiconductor memory device 6320 so as to perform commands provided by the processor 6100. The semiconductor memory device 6320 stores data provided from the memory controller 6310 and provides the stored data to the memory controller 6310. The semiconductor memory device 6320 may include a plurality of memory chips, e.g., a DRAM, a static random access memory (SRAM), or a non-volatile memory. The computing system 6000 may be, e.g., a desktop computer, a laptop computer, a workstation, or a handheld device.

According to example embodiments, during memory operations of a plurality of memory chips, a same ODT unit may be used when performing memory operations of all the memory chips, while the remaining ODT units may be deactivated. The ODT units may be switchable, e.g., first and second ODT units may have complimentary activation and deactivation states, so one ODT unit may be activated to replace operation of a deactivated ODT unit. The plurality of memory chips may share a data pin, thereby enabling data transmission, e.g., termination, to the different memory chips despite the deactivated ODT units. As such, turning on/off of different ODT units when using a plurality of memory chips may be eliminated, thereby preventing or substantially minimizing signal degradation.

In contrast, when a plurality of memory chips are integrated in one package to increase capacity and speed of a semiconductor memory device, timing skews may occur when turning on/off ODT units in a plurality of memory chips. That is, when the ODT unit of each of the memory chips is turned on/off to perform memory operations in each respective memory chip, two or more chips may be turned on or turned off simultaneously, thereby causing a conflict, e.g., timing skews, between the transmitted signals, which in turn, may degrade signal integrity. In addition, the plurality of memory chips may be in different operating modes, and equivalent resistance values of the ODT units may be changed according to the operating states of the memory chips and the turning on/off states of the ODT unit, thereby further degrading signal integrity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
    a first memory chip including a first on die termination (ODT) unit electrically connected to a first pad, the first pad being connected to a first terminal to receive a first signal; and
    a second memory chip including a second ODT unit electrically connected to a second pad, the second pad being connected to the first terminal to receive the first signal,
    wherein the first ODT unit is configured to turn on/off according to a memory operation, the second ODT unit is configured to turn off regardless of the memory operation, and the first and second ODT are switchable.

2. The semiconductor memory device as claimed in claim 1, wherein the first signal is a data signal, and when a data write operation of the semiconductor memory device is performed, the first ODT unit is turned on during input of the data signal.

3. The semiconductor memory device as claimed in claim 1, wherein:
    the first memory chip further includes a third pad connected to a second terminal, the third pad being configured to receive a first ODT control signal,
    the second memory chip further includes a fourth pad connected to a third terminal, the fourth pad being configured to receive a second ODT control signal, and
    one of the first and second ODT control signals is deactivated regardless of the memory operation.

4. The semiconductor memory device as claimed in claim 3, wherein each of the first and second ODT control signals has a signal level according to an operating status of the semiconductor memory device and is configured to turn on/off a status of a respective first ODT unit or second ODT unit.

5. The semiconductor memory device as claimed in claim 1, wherein, when the first memory chip operates in a first mode and the second memory chip operates in a second mode, the first ODT unit is maintained in a turned off status, and the turning on/off of the second ODT unit is controlled by the memory operation.

6. The semiconductor memory device as claimed in claim 5, wherein the first mode is one of a refresh mode and a deep power down mode, and the second mode is a normal operating mode.

7. The semiconductor memory device as claimed in claim 1, wherein each of the first and second ODT units includes a termination resistor and a switch unit, the termination resistor being configured to provide a transfer line for transferring the first signal with a resistance component, and the switch unit being configured to control a connection between the termination resistor and the transfer line.

8. The semiconductor memory device as claimed in claim 7, wherein the first signal is a data signal, and when a data write operation of the semiconductor memory device is performed, the switch unit in the first ODT unit is turned on when the data signal is input.

9. A memory controller controlling a memory operation of a semiconductor memory device with a plurality of memory chips and respective on die termination (ODT) units, the memory controller including:
    an ODT control signal generator configured to generate a first ODT control signal for controlling turning on/off operations of a first ODT unit in one of the plurality of memory chips according to the memory operation, to generate a second ODT control signal for maintaining a turned off status of ODT units in the memory chips other than the first ODT unit regardless of the memory operation, and to alterably provide the first ODT control signal to one of the plurality of memory chips.

10. The memory controller as claimed in claim 9, wherein the ODT control signal generator is configured to select one of the plurality of memory chips as a representative memory chip and to provide the first ODT control signal to the representative memory chip to control a turning on/off operation of the ODT unit in the representative memory chip, when power is applied to the semiconductor memory device.

11. The memory controller as claimed in claim 10, wherein, when the representative memory chip enters a refresh mode or a deep power down mode, the ODT control signal generator is configured to select one of the other memory chips as the representative memory chip and to control the turning on/off operation of the ODT unit in the re-selected representative memory chip.

12. The memory controller as claimed in claim 9, wherein each of the ODT units includes a termination resistor connected to a data input buffer or the memory chip and at least one switch unit, and when a data write operation of the semiconductor memory device is performed, the first ODT control signal for turning on the switch unit is generated during provision of a data signal to the semiconductor memory device.

13. The memory controller as claimed in claim 12, wherein the ODT control signal generator is configured to generate a plurality of ODT control signals corresponding to the plurality of memory chips, the plurality of ODT control signals being output to the plurality of memory chips via separate paths.

14. The memory controller as claimed in claim 9, further comprising:
    a memory status determination unit configured to determine operating states of the memory chips; and
    an ODT status determination unit configured to determine states of the ODT units in the memory chips, the first and second ODT control signals being generated by using at least one of the memory status determination unit and the ODT status determination unit results.

15. The memory controller as claimed in claim 14, wherein when at least one of the memory status determination unit and the ODT status determination unit is changed, the ODT control signal generator is configured to change the memory chip to which the first ODT control signal is provided.

16. A semiconductor memory device, comprising:
a first memory chip including a first on die termination (ODT) unit electrically connected to a first pad, the first pad being connected to a first terminal to receive a first signal; and
a second memory chip including a second ODT unit electrically connected to a second pad, the second pad being connected to the first terminal to receive the first signal,
wherein only one of the first and second ODT units is configured to turn on/off according to memory operations of the first and second memory chips, and the other one of the first and second ODT units is configured to be deactivated and turn on only when the one of the first and second ODT units is not active.

17. The semiconductor memory device as claimed in claim 16, wherein the first signal is a data signal, and when a data write operation of the semiconductor memory device is performed, the first ODT unit is turned on during an input of the data signal.

18. The semiconductor memory device as claimed in claim 16, wherein the first and second memory chips are configured to perform memory operations simultaneously, only one of the first and second ODT units being configured to turn on during the performed memory operations.

19. The semiconductor memory device as claimed in claim 16, wherein the first and second ODT units are controlled independently via third and fourth pads, respectively.

20. The semiconductor memory device as claimed in claim 19, further comprising a memory controller, the memory controller being electrically connected via separate wirings to the third and fourth pads.

* * * * *